(12) United States Patent
Honma et al.

(10) Patent No.: US 12,552,926 B2
(45) Date of Patent: Feb. 17, 2026

(54) RESIN COMPOSITION, PREPREG, FILM WITH RESIN, SHEET OF METAL FOIL WITH RESIN, METAL-CLAD LAMINATE, AND PRINTED WIRING BOARD

(71) Applicant: Panasonic Intellectual Property Management Co., Ltd., Osaka (JP)

(72) Inventors: Masafumi Honma, Fukushima (JP); Ryuji Takahashi, Fukushima (JP); Teppei Washio, Fukushima (JP); Yuichi Ishikawa, Fukushima (JP); Hirofumi Midorikawa, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/832,582

(22) PCT Filed: Jan. 12, 2023

(86) PCT No.: PCT/JP2023/000642
§ 371 (c)(1),
(2) Date: Jul. 24, 2024

(87) PCT Pub. No.: WO2023/145472
PCT Pub. Date: Aug. 3, 2023

(65) Prior Publication Data
US 2025/0129245 A1    Apr. 24, 2025

(30) Foreign Application Priority Data

Jan. 28, 2022   (JP) ................. 2022-012411

(51) Int. Cl.
*B32B 3/10* (2006.01)
*C08J 5/24* (2006.01)
(Continued)

(52) U.S. Cl.
CPC .............. *C08L 63/00* (2013.01); *C08J 5/249* (2021.05); *C08L 39/04* (2013.01); *C08J 2339/04* (2013.01);
(Continued)

(58) Field of Classification Search
None
See application file for complete search history.

(56) References Cited

U.S. PATENT DOCUMENTS

2023/0250282 A1    8/2023   Watanabe et al.

FOREIGN PATENT DOCUMENTS

| JP | 2016-196548 | 11/2016 |
|---|---|---|
| JP | 2018-100327 | 6/2018 |

(Continued)

OTHER PUBLICATIONS

JP2018100327A Machine Translation (Year: 2018).*
(Continued)

*Primary Examiner* — Christopher M Polley
(74) *Attorney, Agent, or Firm* — Greenblum & Bernstein, P.L.C.

(57) ABSTRACT

A resin composition contains: a curable resin (A); an acrylic-monomer copolymer (B) having a structure expressed by formulae (1) to (3) and having a weight average molecular weight equal to or greater than 10,000 and equal to or less than 900,000; an inorganic filler (C) where a molybdenum compound is present on at least a part of a surface thereof; and another inorganic filler (D) different from the inorganic filler (C). R1 is either a hydrogen atom or a methyl group. R2 includes at least one of a glycidyl group or an epoxidized alkyl group which is selected from the group consisting of a hydrogen atom, an alkyl group, the glycidyl group, and the
(Continued)

epoxidized alkyl group. R3 is either a hydrogen atom or a methyl group. R4 is Ph (phenyl group), —COOCH$_2$Ph, or —COO(CH$_2$)$_2$Ph.

15 Claims, 5 Drawing Sheets

(51) Int. Cl.
    *C08L 39/04*     (2006.01)
    *C08L 63/00*     (2006.01)
    *H05K 1/03*     (2006.01)

(52) U.S. Cl.
    CPC ........ *C08J 2363/02* (2013.01); *C08J 2433/04* (2013.01); *C08J 2463/04* (2013.01); *C08J 2483/04* (2013.01); *C08L 2203/16* (2013.01); *C08L 2205/03* (2013.01); *C08L 2207/53* (2013.01); *H05K 1/0373* (2013.01)

(56) References Cited

FOREIGN PATENT DOCUMENTS

| | | | | |
|---|---|---|---|---|
| JP | 2018100327 A | * | 6/2018 | |
| JP | 2021014102 A | * | 2/2021 | ............. B32B 37/26 |
| WO | 2021/010232 | | 1/2021 | |
| WO | 2021/261306 | | 12/2021 | |

OTHER PUBLICATIONS

Machine translation of JP-2018100327-A (Year: 2018).*
Machine translation of JP-2021014102-A (Year: 2021).*
Official Communication issued in International Patent Application No. PCT/JP2023/000642, dated Mar. 7, 2023, along with an English translation thereof.

* cited by examiner

RESIN COMPOSITION, PREPREG, FILM WITH RESIN, SHEET OF METAL FOIL WITH RESIN, METAL-CLAD LAMINATE, AND PRINTED WIRING BOARD

CROSS REFERENCE TO RELATED APPLICATIONS

This application is a National Stage of International Application No. PCT/JP2023/000642 filed on Jan. 12, 2023, that claims priority to Japanese Patent Application No. 2022-012411 filed on Jan. 28, 2022, both of which are incorporated herein by reference in their entirety including the specification, claims, drawings, and abstract.

TECHNICAL FIELD

The present disclosure generally relates to a resin composition, a prepreg, a film with resin, a sheet of metal foil with resin, a metal-clad laminate, and a printed wiring board. More particularly, the present disclosure relates to a resin composition containing a curable resin, a prepreg, a film with resin, a sheet of metal foil with resin, a metal-clad laminate, and a printed wiring board.

BACKGROUND ART

Patent Document 1 discloses a resin composition for use in printed wiring boards. The resin composition for use in printed wiring boards is a thermosetting resin composition for use to form an insulating layer of a printed wiring board. The resin composition for use in printed wiring boards contains a maleimide compound (A), a benzoxazine compound (B), and an inorganic filler (C). The maleimide compound (A) includes at least a particular maleimide compound (A1). This allows an insulating layer made of the resin composition for use in printed wiring boards of Patent Document 1 to exhibit heat resistance.

Patent Document 1 teaches providing a via hole through the insulating layer using a drill machine, for example.

However, Patent Document 1 does not take the drillability of the insulating layer into careful consideration. In this case, the drillability is rated by, for example, bit breakage resistance (indicating the degree of breakage resistance of a drill bit) and hole position accuracy.

CITATION LIST

Patent Literature

Patent Document 1: JP 2016-196548 A

SUMMARY OF INVENTION

An object of the present disclosure is to provide a resin composition, a prepreg, a film with resin, a sheet of metal foil with resin, a metal-clad laminate, and a printed wiring board, all of which contribute to forming an insulating layer with both heat resistance and drillability.

A resin composition according to an aspect of the present disclosure contains: a curable resin (A); an acrylic-monomer copolymer (B) having a structure expressed by the following formulae (1), (2), and (3) and having a weight average molecular weight equal to or greater than 10,000 and equal to or less than 900,000; an inorganic filler (C), where a molybdenum compound is present on at least a part of a surface of the inorganic filler (C); and another inorganic filler (D) different from the inorganic filler (C).

$$\left[ \begin{array}{c} CH_2 - C \\ | \\ R4 \end{array} \right]_z \quad (3)$$

In the formulae (1) to (3), x, y, and z represent mole fractions and satisfy $x+y+z \leq 1$, $0 < x \leq 0.2$, $0.6 \leq y \leq 0.95$, and $0.05 \leq z \leq 0.2$.

In the formula (2), R1 is either a hydrogen atom or a methyl group, and R2 includes at least one of a glycidyl group or an epoxidized alkyl group, which is selected from the group consisting of a hydrogen atom, an alkyl group, the glycidyl group, and the epoxidized alkyl group.

In the formula (3), R3 is either a hydrogen atom or a methyl group, and R4 is Ph (phenyl group), —COOCH$_2$Ph, or —COO(CH$_2$)$_2$Ph.

A prepreg according to another aspect of the present disclosure includes: a base member; and a resin layer including either the resin composition described above or a semi-cured product of the resin composition, each of which is impregnated into the base member.

A film with resin according to still another aspect of the present disclosure includes: a resin layer including either the resin composition described above or a semi-cured product of the resin composition; and a supporting film supporting the resin layer thereon.

A sheet of metal foil with resin according to still another aspect of the present disclosure includes: a resin layer including either the resin composition described above or a semi-cured product of the resin composition; and a sheet of metal foil bonded to the resin layer.

A metal-clad laminate according to yet another aspect of the present disclosure includes: an insulating layer including either a cured product of the resin composition described above or a cured product of the prepreg described above; and a metal layer bonded to the insulating layer.

A printed wiring board according to yet another aspect of the present disclosure includes: an insulating layer including either a cured product of the resin composition described above or a cured product of the prepreg described above; and conductor wiring formed on the insulating layer.

DESCRIPTION OF EMBODIMENTS

1. Overview

The present inventors carried out extensive research to provide a resin composition contributing to forming an insulating layer with both heat resistance and drillability. As a result, the present inventors conceived the concept of a resin composition having the following structure. Specifically, a resin composition according to an exemplary embodiment contains a curable resin (A), an acrylic-monomer copolymer (B), an inorganic filler (C), and an inorganic filler (D).

In this resin composition, the acrylic-monomer copolymer (B) has a structure expressed by the following formulae (1), (2), and (3) and has a weight average molecular weight equal to or greater than 10,000 and equal to or less than 900,000.

A molybdenum compound is present on at least a part of the surface of the inorganic filler (C).

The inorganic filler (D) is different from the inorganic filler (C).

(1)

(2)

(3)

In the formulae (1) to (3), x, y, and z represent mole fractions and satisfy x+y+z≤1, 0<x≤0.2, 0.6≤y≤0.95, and 0.05≤z≤0.2.

In the formula (2), R1 is either a hydrogen atom or a methyl group, and R2 includes at least one of a glycidyl group or an epoxidized alkyl group, which is selected from the group consisting of a hydrogen atom, an alkyl group, the glycidyl group, and the epoxidized alkyl group.

In the formula (3), R3 is either a hydrogen atom or a methyl group, and R4 is Ph (phenyl group), —COOCH$_2$Ph, or —COO(CH$_2$)$_2$Ph.

This embodiment contributes to forming an insulating layer with both heat resistance and drillability.

2. Details (1) Resin Composition
(1.1) Chemical Makeup

A resin composition according to this embodiment contains a curable resin (A), an acrylic-monomer copolymer (B), an inorganic filler (C), and an inorganic filler (D). The resin composition preferably further contains core-shell rubber (E). Optionally, the resin composition may further contain other components (F). The respective components will be described one by one below.

<Curable Resin (A)>

The curable resin (A) may include, without limitation, at least one selected from the group consisting of an epoxy compound (A1), a maleimide compound (A2), an oxazine compound (A3), and a phenolic compound (A4).

<<Epoxy Compound (A1)>>

Examples of the epoxy compound (A1) include, without limitation, biphenyl epoxy resins, naphthalene epoxy resins, bisphenol epoxy resins, novolac epoxy resins, xylylene epoxy resins, aryl-alkylene epoxy resins, naphthalene skeleton-modified epoxy resins, triphenyl-methane epoxy resins, anthracene epoxy resins, dicyclopentadiene epoxy resins, norbornene epoxy resins, and fluorene epoxy resins.

The epoxy compound (A1) preferably includes an epoxy compound (A1a) having a biphenyl structure and/or an epoxy compound (A1b) having a naphthalene structure. The epoxy compound (A1a) having the biphenyl structure is synonymous with biphenyl epoxy resin. The epoxy compound (A1b) having the naphthalene structure is synonymous with a naphthalene epoxy resin.

<<Maleimide Compound (A2)>>

The maleimide compound (A2) herein refers to a compound having at least one five-membered ring (maleimide group) in which maleic acid turns into an imide. The maleimide compound (A2) preferably includes a maleimide compound (A2a) expressed by the following formula (4) and/or a maleimide compound (A2b) expressed by the following formula (5):

(4)

In the formula (4), R represents either hydrogen or an alkyl group, Y1 and Y2 represent an alkylene group, n is an integer falling within a range from 0 to 4, and Rs are either the same or different from each other.

(5)

In the formula (5), X1 and X2 represent an alkylene group and n is an integer falling within the range from 0 to 4.

<<Oxazine Compound (A3)>>

The oxazine compound (A3) is a compound having at least one oxazine ring. The oxazine ring is a six-membered ring having one oxygen atom, one nitrogen atom, and two double bonds. The oxazine compound (A3) preferably includes an ally-group-containing benzoxazine compound (A3.1). The allyl-group-containing benzoxazine compound (A3.1) is a benzoxazine compound having at least one allyl group. The benzoxazine compound is a compound having at least one benzoxazine ring.

Examples of the allyl-group-containing benzoxazine compound (A3.1) include, without limitation, a benzoxazine compound having a structure expressed by the following formula (a3.1-1), a benzoxazine compound having a structure expressed by the following formula (a3.1-2), and a benzoxazine compound having a structure expressed by the following formula (a3.1-3).

(a3.1-1)

(a3.1-2)

(a3.1-3)

<<Phenolic Compound (A4)>>

Examples of the phenolic compound (A4) include, without limitation, novolac phenolic resins, naphthalene phenolic resins, biphenyl-aralkyl phenolic resins, and dicyclopentadiene phenolic resins.

<<Quantitative Relationship in Curable Resin (A)>>

If the curable resin (A) contains the maleimide compound (A2) and the oxazine compound (A3), then the content of the maleimide compound (A2) is preferably equal to or greater than 50 parts by mass and equal to or less than 77 parts by mass, and more preferably equal to or greater than 55 parts by mass and equal to or less than 75 parts by mass, with respect to 100 parts by mass in total of the maleimide compound (A2) and the oxazine compound (A3).

If the curable resin (A) contains the maleimide compound (A2) and the allyl-group-containing benzoxazine compound (A3.1), then the ratio by mass (A3.1/A2) of the allyl-group-containing benzoxazine compound (A3.1) to the maleimide compound (A2) is preferably equal to or greater than 0.3 and equal to or less than 1.0 and more preferably equal to or greater than 0.35 and equal to or less than 0.8. Setting the ratio by mass (A3.1/A2) at a value equal to or greater than 0.3 may reduce the chances of causing a decline in adhesive strength to a metal layer (such as a sheet of copper foil). This may also reduce the chances of causing a decline in drillability. Setting the ratio by mass (A3.1/A2) at a value equal to or less than 1.0 may reduce the chances of causing a decline in glass transition temperature (Tg).

If the curable resin (A) contains the epoxy compound (A1), the maleimide compound (A2), and the oxazine compound (A3), then the total content of the maleimide compound (A2) and the oxazine compound (A3) is preferably equal to or greater than 20 parts by mass and equal to or less than 90 parts by mass, and more preferably equal to or greater than 30 parts by mass and equal to or less than 90 parts by mass, with respect to 100 parts by mass of the curable resin (A).

If the curable resin (A) contains the epoxy compound (A1) and the phenolic compound (A4) but does not contain any oxazine compound, then the equivalent ratio (active hydrogen equivalent/epoxy equivalent) of the phenolic compound (A4) to the epoxy compound (A1) is preferably equal to or greater than 0.85 and equal to or less than 1.15, and more preferably equal to or greater than 0.90 and equal to or less than 1.10.

<Acrylic-Monomer Copolymer (B)>

The acrylic-monomer copolymer (B) has a structure expressed by the following formulae (1), (2), and (3):

In the formulae (1) to (3), x, y, and z represent mole fractions and satisfy $x+y+z \leq 1$, $0 < x \leq 0.2$, $0.6 \leq y \leq 0.95$, and $0.05 \leq z \leq 0.2$.

In the formula (2), R1 is either a hydrogen atom or a methyl group, and R2 includes at least one of a glycidyl group or an epoxidized alkyl group, which is selected from the group consisting of a hydrogen atom, an alkyl group, the glycidyl group, and the epoxidized alkyl group.

In the formula (3), R3 is either a hydrogen atom or a methyl group, and R4 is Ph (phenyl group), —COOCH$_2$Ph, or —COO(CH$_2$)$_2$Ph.

It is preferable that, the main chain of the acrylic-monomer copolymer (B) have at least one structure expressed by the formula (1), at least one structure expressed by the formula (2), and at least one structure expressed by the formula (3).

If the main chain of the acrylic-monomer copolymer (B) has such structures expressed by the formulae (1), (2), and (3), respectively, the structures expressed by the formulae (1), (2), and (3) may be arranged in any order without limitation. In this case, in the main chain of the acrylic-monomer copolymer (B), the structures expressed by the formula (1) may or may not be continuous with each other, the structures expressed by the formula (2) may or may not be continuous with each other, and the structures expressed by the formula (3) may or may not be continuous with each other.

R2 in the formula (2) includes at least one of a glycidyl group or an epoxidized alkyl group which is selected from the group consisting of a hydrogen atom, an alkyl group, the glycidyl group, and the epoxidized alkyl group. It will be described supplementally what this limitation means. As a premise, there is one R2 in one structure expressed by the formula (2). A situation where the acrylic-monomer copolymer (B) has only one structure expressed by the formula (2) and a situation where the acrylic-monomer copolymer (B) has two or more structures expressed by the formula (2) will be described separately.

In the former case, i.e., if the acrylic-monomer copolymer (B) has one structure expressed by the formula (2), R2 is either a glycidyl group or an epoxidized alkyl group.

In the latter case, i.e., if the acrylic-monomer copolymer (B) has two or more structures expressed by the formula (2), R2 in at least one of the structures expressed by the formula (2) is either a glycidyl group or an epoxidized alkyl group, while R2 in the other structure(s) expressed by the formula (2) is either a hydrogen atom or an alkyl group. Since R2 in the at least one structure expressed by the formula (2) is either a glycidyl group or an epoxidized alkyl group, R2 in all the structures expressed by the formula (2) may be a glycidyl group or an epoxidized alkyl group.

Figure 4:
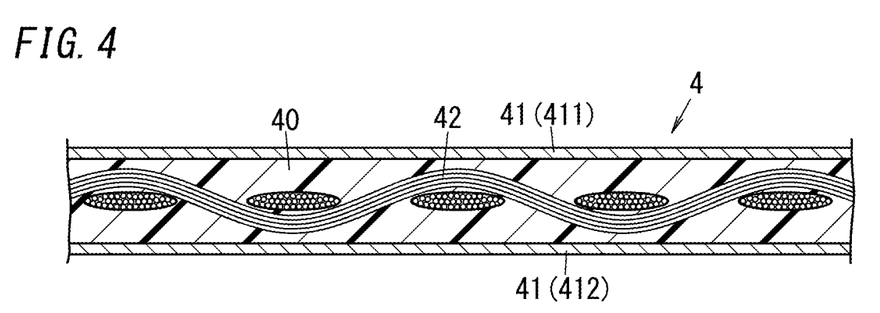
FIG. 4 is a schematic cross-sectional view illustrating a metal-clad laminate according to the exemplary embodiment of the present disclosure.
Figure 5:
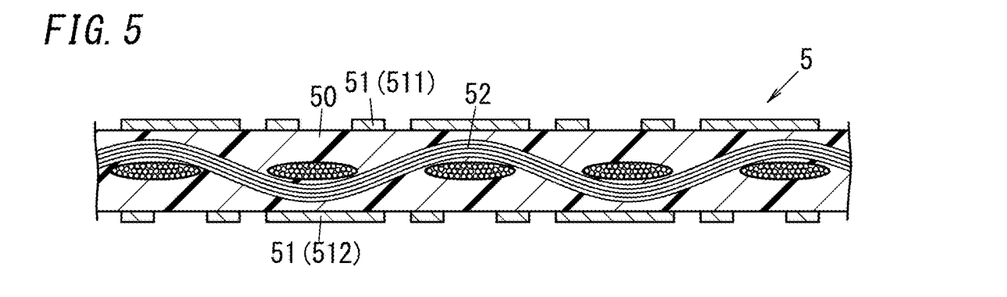
FIG. 5 is a schematic cross-sectional view illustrating a printed wiring board according to the exemplary embodiment of the present disclosure.

The structure expressed by the formula (3) has Ph (i.e., phenyl group), —COOCH$_2$Ph, and —COO(CH$_2$)$_2$Ph. Since Ph, —COOCH$_2$Ph, and —COO(CH$_2$)$_2$Ph are thermally stable, the strength of the cured product of the resin composition may be increased, and therefore, the laminate (metal-clad laminate 4 and printed wiring board 5) may have their heat resistance increased.

The weight average molecular weight (Mw) of the acrylic-monomer copolymer (B) is equal to or greater than 10,000 and equal to or less than 900,000, and preferably equal to or greater than 10,000 and equal to or less than 600,000. Setting the weight average molecular weight (Mw) of the acrylic-monomer copolymer (B) at a value equal to or greater than 10,000 enables improving chemical resistance. Setting the weight average molecular weight (Mw) of the acrylic monomer copolymer (B) at a value equal to or less than 900,000 enables improving moldability.

<Inorganic Filler (C)>

A molybdenum compound is present on at least part of the surface of the inorganic filler (C). More specifically, the inorganic filler (C) is an aggregate of inorganic particles (carriers), and a molybdenum compound is supported on at least part of the surface of each inorganic particle. Examples of the inorganic filler (C) include, without limitation, talc. The molybdenum compound preferably includes zinc molybdate and/or calcium molybdate.

The presence of the molybdenum compound on at least part of the surface of the inorganic filler (C) improves bit breakage resistance. That is to say, adding the inorganic filler (C) to the resin composition reduces the chances of the drill bit breaking when drilling a cured product of the resin composition. In addition, this also improves the dimensional stability of the cured product.

The 50% volume average particle size (D50) of the inorganic filler (C) is preferably equal to or greater than 0.1 μm and equal to or less than 6.0 μm, more preferably equal to or greater than 0.1 μm and equal to or less than 5.0 μm, and even more preferably equal to or greater than 0.1 μm and equal to or less than 4.0 μm. As used herein, "50% volume average particle size" refers to a particle size (D50) at an integrated value of 50% in a particle size distribution measured by a laser scattering/diffraction method using a particle size analyzer.

<Inorganic Filler (D)>

The inorganic filler (D) is different from the inorganic filler (C). More specifically, the inorganic filler (D) is also an aggregate of inorganic particles, but the type of inorganic particles of the inorganic filler (D) is different from the type of inorganic particles of the inorganic filler (C). The inorganic filler (D) preferably contains at least one selected from the group consisting of silica, aluminum hydroxide, magnesium hydroxide and boehmite. However, the inorganic filler (D) does not contain talc.

As for the inorganic filler (D), it does not matter whether the molybdenum compound is included there or not. That is to say, the molybdenum compound may or may not be present on at least part of the surface of the inorganic filler (D). More specifically, a molybdenum compound may or may not be supported on at least part of the surface of each inorganic particle contained in the inorganic filler (D).

Adding the inorganic filler (D) to the resin composition improves not only the hole position accuracy but also the dimensional stability of the cured product as well.

The 50% volume average particle size (D50) of the inorganic filler (D) is preferably equal to or greater than 0.1 μm and equal to or less than 7.0 μm, more preferably equal to or greater than 0.1 μm and equal to or less than 6.0 μm, and even more preferably equal to or greater than 0.1 μm and equal to or less than 5.0 μm.

<Core-Shell Rubber (E)>

The core-shell rubber (E) is an aggregate of rubber particles, and each rubber particle has a core-shell multilayer structure. Each rubber particle is made up of a core and a shell. At least one of the core or the shell has elasticity. Adding such core-shell rubber (D) to the resin composition enables increasing the impact resistance, thermal shock resistance, and drillability of the cured product without sacrificing the heat resistance.

The core-shell rubber (E) preferably contains silicone in at least one of the core or the shell. This may further enhance the thermal shock resistance. In other words, the impact resistance may be enhanced even at lower temperatures than in a situation where silicone is not included.

The core may contribute to increasing the toughness of the cured product of the resin composition. The core is rubber in the shape of a particle. The rubber may be either a copolymer or a homopolymer, whichever is appropriate. Examples of the polymer that forms the core may include, without limitation, silicone/acrylic polymers, acrylic polymers, silicone polymers, butadiene polymers, and isoprene polymers.

The shell is easily compatible with the curable resin (B) and may contribute to increasing the adhesive strength. The shell is present on the surface of the core. The shell is made up of multiple graft chains. One end of each graft chain is bonded to the surface of the core to form a fixed end, while the other end of each graft chain is a free end. The graft chain may be a copolymer or a homopolymer, whichever is appropriate. Examples of the polymer that forms the shell include, without limitation, acrylic copolymers, polymethyl methacrylate, and polystyrene.

The 50% volume average particle size (D50) of the core-shell rubber (E) is preferably equal to or greater than 0.01 μm and equal to or less than 0.5 μm, more preferably equal to or greater than 0.05 μm and equal to or less than 0.3 μm. Setting the 50% volume average particle size (D50) of the core-shell rubber (E) at a value equal to or greater than 0.01 μm enables further enhancing the impact resistance of the cured product. Setting the 50% volume average particle size (D50) of the core-shell rubber (E) at a value equal to or less than 0.5 μm allows the core-shell rubber (E) to be easily dispersed uniformly in the resin composition, and therefore, easily dispersed uniformly in the cured product as well.

<Other Components (F)>

The other components (F) are components other than the curable resin (A), the acrylic-monomer copolymer (B), the inorganic filler (C), the inorganic filler (D), and the core-shell rubber (E). Specific examples of the other components (F) include, without limitation, phosphorus-based flame retardants, curing accelerators, catalysts (polymerization initiators), additives, and solvents.

Examples of the phosphorus-based flame retardant include, without limitation, phosphine oxide compounds (xylylene bisdiphenylphosphine oxide), and phosphaphenanthrene phosphorus compounds. Among the phosphaphenanthrene phosphorus compounds, a phosphaphenanthrene phosphorus compound having a reactive unsaturated group (for example, product name "SD-5" manufactured by SANKO Inc.) is particularly preferred.

The curing accelerator contains an imidazole compound. Examples of the imidazole compound include, without limitation, 2-ethyl-4-methylimidazole.

Examples of the catalyst include, without limitation, α,α'-di(t-butylperoxy) diisopropylbenzene.

Examples of the additives include, without limitation, coupling agents and dispersants.

Examples of the solvent include, without limitation, methyl ethyl ketone (MEK). By adjusting the amount of the solvent, the resin composition may be turned into a varnish.

<Quantitative Relationship Between Components>

The content of the acrylic-monomer copolymer (B) is preferably equal to or greater than 5 parts by mass and equal to or less than 25 parts by mass, more preferably equal to or greater than 5 parts by mass and equal to or less than 20 parts by mass, and even more preferably equal to or greater than 10 parts by mass and equal to or less than 18 parts by mass, with respect to 100 parts by mass of the curable resin (A).

The content of the inorganic filler (C) is preferably equal to or greater than 5 parts by mass and equal to or less than 35 parts by mass, and more preferably equal to or greater than 5 parts by mass and equal to or less than 25 parts by mass, with respect to 100 parts by mass of the curable resin (A).

The content of the inorganic filler (D) is preferably equal to or greater than 50 parts by mass and equal to or less than 175 parts by mass, more preferably equal to or greater than 80 parts by mass and equal to or less than 175 parts by mass, and even more preferably equal to or greater than 100 parts by mass and equal to or less than 170 parts by mass, with respect to 100 parts by mass of the curable resin (A).

The content of the inorganic filler (C) is preferably equal to or greater than 1 part by mass and equal to or less than 15 parts by mass and more preferably equal to or greater than 1 part by mass and equal to or less than 10 parts by mass, with respect to 100 parts by mass in total of the curable resin (A), the acrylic-monomer copolymer (B), the inorganic filler (C), and the inorganic filler (D).

(1.2) Manufacturing Method

A resin composition according to this embodiment may be manufactured by compounding the curable resin (A), the acrylic-monomer copolymer (B), the inorganic filler (C), and the inorganic filler (D). If necessary, the core-shell rubber (E) and/or the other components (F) may be further added thereto.

(2) Prepreg

Figure 1:
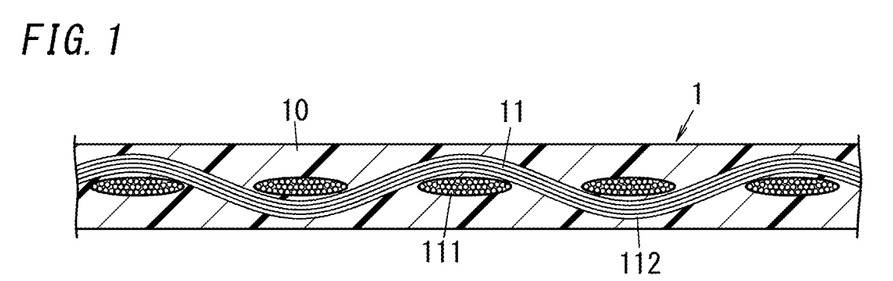
FIG. 1 is a schematic cross-sectional view illustrating a prepreg according to an exemplary embodiment of the present disclosure.

FIG. 1 illustrates a prepreg 1 according to this embodiment. The prepreg 1 may be used, for example, as a material for a printed wiring board 5. The prepreg 1 includes a base member 11 and a resin layer 10.

The base member 11 may be formed by, for example, plain weave. That is to say, the base member 11 is formed by weaving a warp 111 and a woof 112 crossing each other. The base member 11 may be, without limitation, a piece of glass cloth, for example. Examples of the glass fiber as a constituent material for the glass cloth include, without limitation, E glass, S glass, Q glass, T glass, TS glass, NE glass, and L glass. Among other things, S glass, Q glass, T glass, TS glass, NE glass, and L glass are particularly preferred from the viewpoint of low thermal expansibility. That is why the glass cloth preferably includes at least one glass fiber selected from the group consisting of S glass, Q glass, T glass, TS glass, NE glass, and L glass. Note that the thickness of the base member 11 is not limited to any particular value.

The resin layer 10 includes either the resin composition or a semi-cured product of the resin composition, each of which has been impregnated into the base member 11. As used herein, the semi-cured product of the resin composition refers to a resin composition in an intermediate stage (Stage B) of a curing reaction. Note that the thickness of the resin layer 10 is not limited to any particular value.

(3) Film with Resin

Figure 2:
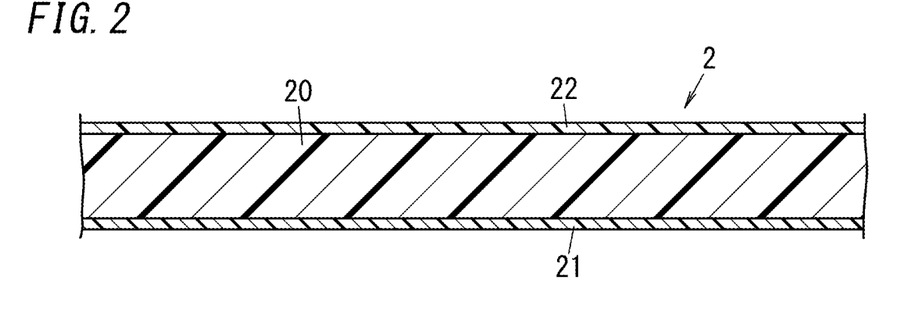
FIG. 2 is a schematic cross-sectional view illustrating a film with resin according to the exemplary embodiment of the present disclosure.

FIG. 2 illustrates a film 2 with resin according to this embodiment. The film 2 with resin may be used as a material in a buildup process, for example. The film 2 with resin includes a resin layer 20, a supporting film 21, and a protective film 22.

The resin layer 20 includes either the resin composition or a semi-cured product of the resin composition. Note that the thickness of the resin layer 20 is not limited to any particular value.

The supporting film 21 supports the resin layer 20 thereon. The supporting film 21 is temporarily fixed to one surface of the resin layer 20. The supporting film 21 may be peeled off from the resin layer 20 as needed.

The protective film 22 protects the resin layer 20. The protective film 22 is temporarily fixed to the other surface of the resin layer 20. The protective film 22 may be peeled off from the resin layer 20 as needed.

(4) Sheet of Metal Foil with Resin

Figure 3:
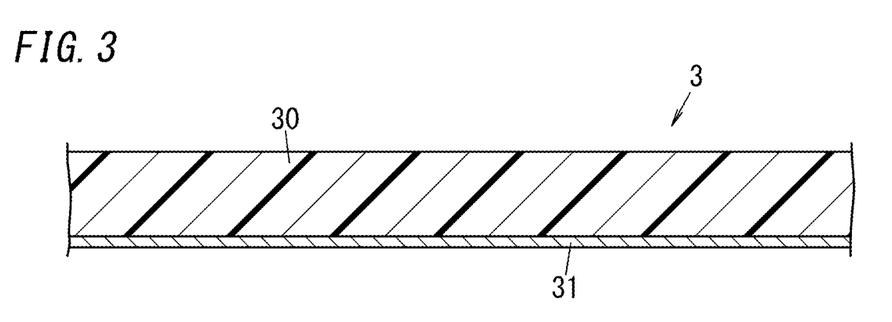
FIG. 3 is a schematic cross-sectional view illustrating a sheet of metal foil with resin according to the exemplary embodiment of the present disclosure.

FIG. 3 illustrates a sheet of metal foil 3 with resin according to this embodiment. The sheet of metal foil 3 with resin may be used as a material in a buildup process, for example. The sheet of metal foil 3 with resin includes a resin layer 30 and a sheet of metal foil 31.

The resin layer 30 contains either the resin composition or a semi-cured product of the resin composition. Note that the thickness of the resin layer 30 is not limited to any particular value.

The sheet of metal foil 31 is bonded to one surface of the resin layer 30. The sheet of metal foil 31 may be, without limitation, a sheet of copper foil, for example.

(5) Metal-Clad Laminate

FIG. 4 illustrates a metal-clad laminate 4 according to this embodiment. The metal-clad laminate 4 may be used as a material for a printed wiring board 5. The metal-clad laminate 4 includes an insulating layer 40 and at least one metal layer 41.

The insulating layer 40 includes either a cured product of the resin composition or a cured product of the prepreg 1. The insulating layer 40 is a layer with electrical insulation properties. Note that the thickness of the insulating layer 40 is not limited to any particular value.

The metal layer(s) 41 is/are bonded to the insulating layer 40. In this embodiment, the metal layer 41 includes a first metal layer 411 and a second metal layer 412. The first metal layer 411 is bonded to one surface of the insulating layer 40. The second metal layer 412 is bonded to the other surface of the insulating layer 40. That is to say, the metal-clad laminate 4 shown in FIG. 4 is a double-sided metal-clad laminate. Either the first metal layer 411 or the second metal layer 412 may be omitted from the metal-clad laminate 4. In that case, the metal-clad laminate 4 is a single-sided metal-clad laminate.

(6) Printed Wiring Board

FIG. 5 illustrates a printed wiring board 5 according to this embodiment. Electronic components (not shown) are mounted on the printed wiring board 5, thereby forming a printed circuit assembly thereon. The printed wiring board 5 plays the role of physically supporting the electronic components thereon. The printed wiring board 5 includes an insulating layer 50 and conductor wiring 51.

The insulating layer 50 includes either a cured product of the resin composition or a cured product of the prepreg 1. The insulating layer 50 is a layer with electrical insulation properties. Note that the thickness of the insulating layer 50 is not limited to any particular value.

The conductor wiring 51 is provided to form an electronic circuit by electrically connecting the electronic components together. The conductor wiring 51 is formed on the insulating layer 50. In this embodiment, the printed wiring board 5 includes two layers, each including the conductor wiring 51. That is to say, the conductor wiring 51 includes first conductor wiring 511 and second conductor wiring 512. The first conductor wiring 511 is formed on one surface of the insulating layer 50. The second conductor wiring 512 is formed on the other surface of the insulating layer 50. Optionally, the first conductor wiring 511 and the second conductor wiring 512 may be interconnected to each other. The insulating layer 50 includes the resin composition described above, and therefore, has excellent drillability. This reduces, when the insulating layer 50 is drilled for the purpose of interconnection, the chances of breaking the drill bit and also improves the hole position accuracy as well.

The printed wiring board 5 may include three or more layers, each including the conductor wiring 51. That is to say, the printed wiring board 5 may be a multilayer printed wiring board.

3. Aspects

As can be seen from the foregoing description of exemplary embodiments, the present disclosure has the following aspects. In the following description, reference signs are added in parentheses to the respective constituent elements solely for the purpose of clarifying the correspondence between those aspects of the present disclosure and the exemplary embodiments described above.

A first aspect is a resin composition, which contains: a curable resin (A): an acrylic-monomer copolymer (B) having a structure expressed by the following formulae (1), (2), and (3) and having a weight average molecular weight equal to or greater than 10,000 and equal to or less than 900,000; an inorganic filler (C), where a molybdenum compound is present on at least a part of a surface of the inorganic filler (C); and another inorganic filler (D) different from the inorganic filler (C).

This aspect contributes to forming an insulating layer (40, 50) with both heat resistance and drillability.

A second aspect is a resin composition which may be implemented in conjunction with the first aspect. In the second aspect, the curable resin (A) includes at least one selected from the group consisting of an epoxy compound (A1), a maleimide compound (A2), an oxazine compound (A3), and a phenolic compound (A4).

This aspect contributes to forming an insulating layer (40, 50) with both heat resistance and drillability.

A third aspect is a resin composition which may be implemented in conjunction with the second aspect. In the third aspect, the epoxy compound (A1) includes an epoxy compound (A1a) having a biphenyl structure and/or an epoxy compound (A1b) having a naphthalene structure.

This aspect contributes to forming an insulating layer (40, 50) with both heat resistance and drillability.

A fourth aspect is a resin composition which may be implemented in conjunction with the second or third aspect. In the fourth aspect, the maleimide compound (A2) includes a maleimide compound (A2a) expressed by the formula (4) and/or a maleimide compound (A2b) expressed by the formula (5).

This aspect contributes to forming an insulating layer (40, 50) with both heat resistance and drillability.

A fifth aspect is a resin composition which may be implemented in conjunction with any one of the first to fourth aspects. In the fifth aspect, the content of the acrylic-monomer copolymer (B) is equal to or greater than 5 parts by mass and equal to or less than 15 parts by mass with respect to 100 parts by mass of the curable resin (A).

This aspect contributes to forming an insulating layer (40, 50) with both heat resistance and drillability.

A sixth aspect is a resin composition which may be implemented in conjunction with any one of the first to fifth aspects. In the sixth aspect, the content of the inorganic filler (C) is equal to or greater than 5 parts by mass and equal to or less than 35 parts by mass, and the content of the inorganic filler (D) is equal to or greater than 50 parts by mass and equal to or less than 175 parts by mass, with respect to 100 parts by mass of the curable resin (A).

This aspect contributes to forming an insulating layer (40, 50) with both heat resistance and drillability.

A seventh aspect is a resin composition which may be implemented in conjunction with any one of the first to sixth aspects. In the seventh aspect, the molybdenum compound includes zinc molybdate and/or calcium molybdate.

This aspect contributes to improving the bit breakage resistance.

An eighth aspect is a resin composition which may be implemented in conjunction with any one of the first to seventh aspects. In the eighth aspect, the content of the inorganic filler (C) is equal to or greater than 1 part by mass and equal to or less than 15 parts by mass with respect to 100 parts by mass in total of the curable resin (A), the acrylic-monomer copolymer (B), the inorganic filler (C), and the inorganic filler (D).

This aspect contributes to forming an insulating layer (40, 50) with both heat resistance and drillability.

A ninth aspect is a resin composition which may be implemented in conjunction with any one of the first to eighth aspects. In the ninth aspect, the resin composition further contains core-shell rubber (E).

This aspect contributes to improving the impact resistance, thermal shock resistance, and drillability of the cured product without sacrificing the heat resistance.

A tenth aspect is a resin composition which may be implemented in conjunction with any one of the first to ninth aspects. In the tenth aspect, the inorganic filler (D) includes at least one selected from the group consisting of silica, aluminum hydroxide, magnesium hydroxide, and boehmite.

This aspect contributes to improving not only the hole position accuracy but also the dimensional stability of the cured product as well.

An eleventh aspect is a prepreg (1), which includes: a base member (11); and a resin layer (10) including either the resin composition according to any one of the first to tenth aspects or a semi-cured product of the resin composition, each of which is impregnated into the base member (11).

This aspect contributes to forming an insulating layer (40, 50) with both heat resistance and drillability.

A twelfth aspect is a film (2) with resin, which includes: a resin layer (20) including either the resin composition according to any one of the first to tenth aspects or a semi-cured product of the resin composition; and a supporting film (21) supporting the resin layer (20) thereon.

This aspect contributes to forming an insulating layer (40, 50) with both heat resistance and drillability.

A thirteenth aspect is a sheet of metal foil (3) with resin, which includes: a resin layer (30) including either the resin composition according to any one of the first to tenth aspects or a semi-cured product of the resin composition; and a sheet of metal foil (31) bonded to the resin layer (30).

This aspect contributes to forming an insulating layer (40, 50) with both heat resistance and drillability.

A fourteenth aspect is a metal-clad laminate (4), which includes: an insulating layer (40) including either a cured product of the resin composition according to any one of the first to tenth aspects or a cured product of the prepreg (1) according to the eleventh aspect; and a metal layer (41) bonded to the insulating layer (40).

This aspect allows the insulating layer (40) to have both heat resistance and drillability.

A fifteenth aspect is a printed wiring board (5), which includes: an insulating layer (50) including either a cured product of the resin composition according to any one of the first to tenth aspects or a cured product of the prepreg (1) according to the eleventh aspect; and conductor wiring (51) formed on the insulating layer (50).

This aspect allows the insulating layer (50) to have both heat resistance and drillability.

EXAMPLES

Next, specific examples of the present disclosure will be described. Note that the examples to be described below are only examples of the present disclosure and should not be construed as limiting.

1. Sample (1) Resin Composition
(1.1) Materials
<Curable Resin (A)>
<<Epoxy Compound (A1)>>
[Epoxy compound (A1a)]
    Biphenyl epoxy resin, product name "NC3500" manufactured by Nippon Kayaku Co., Ltd., having an epoxy equivalent of 190 to 230 g/eq.
[Epoxy Compound (A1b)]
    Naphthalene epoxy resin, product name "HP-9500" manufactured by DIC Corporation, having an epoxy equivalent of 220 to 240 g/eq.
<<Maleimide Compound (A2)>>
[Maleimide Compound (A2a)]
    Compound expressed by the formula (4), product name "SE-55" manufactured by Nippon Kayaku Co., Ltd.
[Maleimide Compound (A2b)]
    Compound expressed by the formula (5), product name "BMI-2300" manufactured by Daiwa Fine Chemicals Co., Ltd.
<<Oxazine Compound (A3)>>.
    Allyl-group-containing benzoxazine compound (A3.1), product name "ALP-D" manufactured by Shikoku Chemicals Corporation; and
    Product name "KZH-5031" manufactured by Kolon Industries., Inc.
<<Phenolic Compound (A4)>>
    Product name "MEHC-7403H" manufactured by Meiwa Kasei., Ltd.; and
    Novolac phenolic resin, product name "TD-2090-60M" manufactured by DIC Corporation, having a hydroxyl equivalent of 105 g/eq.
<Acrylic-Monomer Copolymer (B)>
    Acrylic resin, product name "PASR001" manufactured by Nagase ChemteX Corporation, having a weight average molecular weight of 500,000.
<Inorganic Filler (C)>
    Zinc molybdate/magnesium silicate compound, product name "Kemgard 1100" manufactured by Huber Inc., having a D50 of 2 µm; and
    Zinc molybdate/magnesium silicate compound, product name "Kemgard 911C" manufactured by Huber Inc., having a D50 of 3.3 µm.
<Inorganic filler (D)>
    Silica, product name "SC2050-MTX" manufactured by Admatechs, having a D50 of 0.5 µm; and
    Aluminum hydroxide, product name "ALH-F" manufactured by Kawai Lime Industry Co., Ltd., having a D50 of 4.6 µm.
<Core-Shell Rubber (E)>
    Silicone-acrylic composite rubber, product name "SRK200A" manufactured by Mitsubishi Chemical Corporation, having a D50 of 0.2 µm; and
    Silicone-acrylic composite rubber, product name "S-2200" manufactured by Mitsubishi Chemical Corporation, having a D50 of 0.1 µm.
<Other Components (F)>
    α,α'-di(t-butylperoxy) diisopropylbenzene, product name "Perbutyl P" manufactured by NOF Corporation.
(1.2) Manufacturing
A resin composition was manufactured by compounding the respective components at the ratio (parts by mass) shown in the following Table 1. Note that the equivalent ratio (active hydrogen equivalent/epoxy equivalent) of the phenolic compound (A4) to the epoxy compound (A1) was 1.02 in Example 8 and 1.01 in Example 9.

(2) Prepreg

A prepreg was manufactured by impregnating the above-described resin composition into a piece of glass cloth (T glass, #2118 type, WTX2116T manufactured by Nitto Boseki Co., Ltd., having a thickness of 0.1 mm) and then heating and drying the glass cloth at 130-150° C. for about 2-5 minutes.

(3) Metal-Clad Laminate

Eight prepregs, each having the above-described structure, were stacked one on top of another, a sheet of copper foil (with a thickness of 12 μm) was laid on each side of the stack thus formed, and then the assembly thus formed was heated to 220° C. under a pressure of 3 MPa for two hours. In this manner, a metal-clad laminate having a sheet of copper foil bonded to each side thereof (i.e., a copper-clad laminate with a thickness of 0.8 mm) was manufactured.

2. Evaluations (1) Drillability

The drillability was rated under the following machining condition:
<Machining Condition>
Number of metal-clad laminates stacked: two;
Drilling machine: "ND-1A221L" manufactured by Viamechanics;
Entry sheet: product name "LE-G0612" manufactured by Mitsubishi Gas Chemical Company, Inc.;
Backup board: product name "SPB-W 1.5t" manufactured by Nihon Decoluxe Co., Ltd.;
Drill bit: product name "MCW Z303DWU 0.15×2.7" manufactured by Union Tool Co.;
Number of revolutions: 200 krpm;
Feed rate: 2.4 m/min;
Chip load: 12 μm/rev; and
Number of hits: 10,000.
<Bit Breakage Resistance>

The ratio (breaking ratio) of the number of drill bits broken to the total number of drill bits was calculated. The respective samples has their bit breakage resistance rated by grading the samples as follows by the breaking ratio:
Grade A: if the breaking ratio was equal to or less than 10%;
Grade B: if the breaking ratio was greater than 10% and equal to or less than 50%; or
Grade C: if the breaking ratio was greater than 50%.
<Hole Position Accuracy>

The hole position accuracy was represented by the average degree of misalignment between respective holes+3σ (where σ is a standard deviation).

(2) Oven Heat Resistance

The metal-clad laminate was loaded into an oven at 280° C. and into an oven at 290° C. for 1 hour to see, with the naked eyes, if any delamination occurred between multiple layers.

The respective samples had their oven heat resistance rated by grading the samples as follows by the frequency of occurrence of delamination:
Grade A: if no delamination occurred at all;
Grade B: if delamination hardly occurred; or
Grade C: if delamination occurred.
Note that Grades A and B fall within a tolerance range.

(3) Chemical Resistance (3.1) Making Samples

Samples were made by cutting off the metal-clad laminate into multiple pieces, each having dimensions of 50 mm×50 mm×0.8 mm.

(3.2) Initial Drying and Cooling and Measuring Initial Mass

Each sample was dried at 130° C. for 30 minutes using a constant temperature dryer and then cooled at room temperature for 120 minutes or more using a dry desiccator. Thereafter, the initial mass M0 (mg) of the sample was measured using an electronic balance. In addition, the initial surface area S0 ($cm^2$) of the sample was further measured.

(3.3) Swelling

After its initial mass had been measured, each sample was immersed in a swelling liquid (500 ml/L of "Swelling Dip Securiganth P" manufactured by Atotech Japan K. K. and 3 g/L of sodium hydroxide aqueous solution) at 60° C. for 5 minutes.

(3.4) Micro-Etching

After each swollen sample had been washed with hot water, the sample was immersed in an oxidant (580 ml/L of "Concentrate Compact CP" manufactured by Atotech Japan K. K. and 40 g/L of sodium hydroxide aqueous solution) at 80° C. for 10 minutes.

(3.5) Neutralization

After each sample that had been subjected to micro-etching had been washed with hot water, the sample was immersed in neutralizing solution (100 ml/L of "Reduction Solution Securiganth P500" manufactured by Atotech Japan K. K, and 50 ml/L of sulfuric acid (98%)) at 40° C. for 5 minutes. The sample thus neutralized was washed with water and dried with a drier. Thereafter, the sample was dried at 130° C. for 30 minutes in a constant temperature dryer.

(3.6) Measuring Mass of Treated Sample

After having been subjected again to the series of process steps (3.3) to (3.5) (i.e., desmear process steps), each sample was cooled at room temperature for 120 minutes or more using a dry desiccator. Thereafter, the sample that had been subjected to the series of desmear process steps twice had its mass M1 (mg) measured using an electronic balance.

(3.7) Calculating Etch Rate

The etch rate was calculated by the following Equation. The chemical resistance of each sample was rated by this etch rate.

$$(\text{Etch rate}) = (M0 - M1)/S0 \text{ [mg/cm}^2\text{]}$$

Note that an etch rate equal to or less than 0.55 mg/cm$^2$ falls within a tolerance range. The lower the etch rate is, the more beneficial.

TABLE 1

| | | | Examples | | | | | | |
|---|---|---|---|---|---|---|---|---|---|
| | | | 1 | 2 | 3 | 4 | 5 | 6 | 7 |
| Curable Resin (A) | Epoxy compound (A1) | NC3500 | 0 | 20 | 20 | 20 | 20 | 20 | 20 |
| | | HP-9500 | 0 | 0 | 0 | 0 | 0 | 0 | 0 |
| | Phenolic compound (A4) | MEHC-7403H | 0 | 0 | 0 | 0 | 0 | 0 | 0 |
| | | TD-2090-60M | 0 | 0 | 0 | 0 | 0 | 0 | 0 |

TABLE 1-continued

|  |  |  | | | | | | | |
|---|---|---|---|---|---|---|---|---|---|
| Maleimide | BMI-2300 | 33 | 26 | 26 | 26 | 26 | 26 | 26 |
| compound (A2) | SE-55 | 33 | 26 | 26 | 26 | 26 | 26 | 26 |
| Oxazine | ALP-D | 34 | 28 | 0 | 28 | 28 | 28 | 28 |
| compound (A3) | KZH-5031 | 0 | 0 | 28 | 0 | 0 | 0 | 0 |
| Acrylic-monomer copolymer (B) | PASR001 | 10 | 10 | 10 | 10 | 10 | 10 | 10 |
| Core-shell rubber (E) | SRK200A | 10 | 10 | 10 | 0 | 10 | 10 | 25 |
|  | S-2200 | 0 | 0 | 0 | 10 | 0 | 0 | 0 |
| Inorganic filler (D) | SC2050-MTX | 125 | 125 | 125 | 125 | 95 | 125 | 125 |
|  | ALH-F | 0 | 0 | 0 | 0 | 30 | 0 | 0 |
| Inorganic filler (C) | Kemgard 1100 | 25 | 25 | 25 | 25 | 25 | 0 | 25 |
|  | Kemgard 911C | 0 | 0 | 0 | 0 | 0 | 25 | 0 |
| Others (F) Catalyst | Perbutyl P | 1 | 1 | 1 | 1 | 1 | 1 | 1 |
| Drillability Bit breakage resistance | — | A | A | A | A | A | A | A |
| Hole position accuracy | μm | 20 | 25 | 25 | 24 | 21 | 26 | 21 |
| Oven heat resistance | 280° C. × 1 hr | A | A | A | A | A | A | A |
|  | 290° C. × 1 hr | A | A | A | A | A | A | A |
| Chemical resistance (etch rate) | mg/cm² | 0.52 | 0.38 | 0.24 | 0.44 | 0.41 | 0.40 | 0.42 |

|  |  |  | Examples | | | | Cmp. Ex. | |
|---|---|---|---|---|---|---|---|---|
|  |  |  | 8 | 9 | 10 | 11 | 1 | 2 |
| Curable Resin (A) | Epoxy | NC3500 | 43 | 0 | 20 | 20 | 20 | 20 |
|  | compound (A1) | HP-9500 | 0 | 69 | 0 | 0 | 0 | 0 |
|  | Phenolic | MEHC-7403H | 27 | 0 | 0 | 0 | 0 | 0 |
|  | compound (A4) | TD-2090-60M | 0 | 31 | 0 | 0 | 0 | 0 |
|  | Maleimide | BMI-2300 | 15 | 0 | 26 | 26 | 26 | 26 |
|  | compound (A2) | SE-55 | 15 | 0 | 26 | 26 | 26 | 26 |
|  | Oxazine | ALP-D | 0 | 0 | 28 | 28 | 28 | 28 |
|  | compound (A3) | KZH-5031 | 0 | 0 | 0 | 0 | 0 | 0 |
| Acrylic-monomer copolymer (B) | | PASR001 | 10 | 10 | 20 | 10 | 10 | 0 |
| Core-shell rubber (E) | | SRK200A | 10 | 10 | 0 | 10 | 10 | 20 |
|  |  | S-2200 | 0 | 0 | 0 | 0 | 0 | 0 |
| Inorganic filler (D) | | SC2050-MTX | 125 | 125 | 125 | 120 | 185 | 125 |
|  |  | ALH-F | 0 | 0 | 0 | 0 | 0 | 0 |
| Inorganic filler (C) | | Kemgard 1100 | 25 | 25 | 25 | 30 | 0 | 25 |
|  |  | Kemgard 911C | 0 | 0 | 0 | 0 | 0 | 0 |
| Others (F) | Catalyst | Perbutyl P | 1 | 1 | 1 | 1 | 1 | 1 |
| Drillability | Bit breakage resistance | — | A | A | A | A | C | B |
|  | Hole position accuracy | μm | 25 | 28 | 33 | 21 | 35 | 22 |
|  | Oven heat resistance | 280° C. × 1 hr | A | A | A | A | A | A |
|  |  | 290° C. × 1 hr | A | A | A | B | A | A |
| Chemical resistance (etch rate) | | mg/cm² | 0.36 | 0.45 | 0.51 | 0.38 | 0.38 | 0.40 |

The present inventors confirmed that an insulating layer with both sufficient heat resistance and drillability could be formed in each of Examples 1-11.

In contrast, the present inventors confirmed that in Comparative Example 1, sufficient heat resistance was achieved but both the bit breakage resistance and the hole position accuracy were poor. The present inventors confirmed that in Comparative Example 2, sufficient heat resistance and hole position accuracy were achieved but the bit breakage resistance was poor.

REFERENCE SIGNS LIST

1 Prepreg
10 Resin Layer
11 Base Member
2 Film with Resin
20 Resin Layer
21 Supporting Film
3 Sheet of Metal Foil with Resin
30 Resin Layer
31 Sheet of Metal Foil
4 Metal-Clad Laminate
40 Insulating Layer
41 Metal Layer
5 Printed Wiring Board
50 Insulating Layer
51 Conductor Wiring

The invention claimed is:
1. A resin composition containing:
a curable resin (A);
an acrylic-monomer copolymer (B) having a structure expressed by the following formulae (1), (2), and (3) and having a weight average molecular weight equal to or greater than 10,000 and equal to or less than 900,000:

-continued (2)

(3)

an inorganic filler (C), where a molybdenum compound is present on at least a part of a surface of the inorganic filler (C); and another inorganic filler (D) different from the inorganic filler (C), the curable resin (A) including a maleimide compound (A2) and an oxazine compound (A3), and a content of the maleimide compound (A2) being equal to or greater than 50 parts by mass and equal to or less than 77 parts by mass with respect to 100 parts by mass in total of the maleimide compound (A2) and the oxazine compound (A3), wherein
x, y, and z in the formulae (1) to (3) represent mole fractions and satisfy $x+y+z \leq 1$, $0 < x \leq 0.2$, $0.6 \leq y \leq 0.95$, and $0.05 \leq z \leq 0.2$, in the formula (2), R1 is either a hydrogen atom or a methyl group, and R2 includes at least one of a glycidyl group or an epoxidized alkyl group which is selected from the group consisting of a hydrogen atom, an alkyl group, the glycidyl group, and the epoxidized alkyl group, and in the formula (3), R3 is either a hydrogen atom or a methyl group, and R4 is Ph (phenyl group), —COOCH$_2$Ph, or —COO(CH$_2$)$_2$Ph.

2. The resin composition of claim 1, wherein
the curable resin (A) further includes at least one selected from the group consisting of an epoxy compound (A1) and a phenolic compound (A4).

3. The resin composition of claim 2, wherein
the epoxy compound (A1) includes an epoxy compound (A1a) having a biphenyl structure and/or an epoxy compound (A1b) having a naphthalene structure.

4. The resin composition of claim 2, wherein
the maleimide compound (A2) includes:
a maleimide compound (A2a) expressed by the following formula (4):

(4)

where R represents either hydrogen or an alkyl group, Y1 and Y2 represent an alkylene group, n is an integer falling within a range from 0 to 4, and Rs are either the same or different from each other; and/or a maleimide compound (A2b) expressed by the following formula (5):

(5)

where X1 and X2 represent an alkylene group and n is an integer falling within a range from 0 to 4.

5. The resin composition of claim 1, wherein
content of the acrylic-monomer copolymer (B) is equal to or greater than 5 parts by mass and equal to or less than 15 parts by mass with respect to 100 parts by mass of the curable resin (A).

6. The resin composition of claim 1, wherein
content of the inorganic filler (C) is equal to or greater than 5 parts by mass and equal to or less than 35 parts by mass, and content of the inorganic filler (D) is equal to or greater than 50 parts by mass and equal to or less than 175 parts by mass, with respect to 100 parts by mass of the curable resin (A).

7. The resin composition of claim 1, wherein
the molybdenum compound includes zinc molybdate and/or calcium molybdate.

8. The resin composition of claim 1, wherein
content of the inorganic filler (C) is equal to or greater than 1 part by mass and equal to or less than 15 parts by mass with respect to 100 parts by mass in total of the curable resin (A), the acrylic-monomer copolymer (B), the inorganic filler (C), and the inorganic filler (D).

9. The resin composition of claim 1, further containing core-shell rubber (E).

10. The resin composition of claim 1, wherein
the inorganic filler (D) includes at least one selected from the group consisting of silica, aluminum hydroxide, magnesium hydroxide, and boehmite.

11. A prepreg comprising: a base member; and a resin layer including either the resin composition of claim 1 or a semi-cured product of the resin composition, the resin composition or the semi-cured product of the resin composition being impregnated into the base member.

12. A film with resin comprising: a resin layer including either the resin composition of claim 1 or a semi-cured product of the resin composition; and a supporting film supporting the resin layer thereon.

13. A sheet of metal foil with resin, comprising: a resin layer including either the resin composition of claim 1 or a semi-cured product of the resin composition; and a sheet of metal foil bonded to the resin layer.

14. A metal-clad laminate comprising: an insulating layer including a cured product of the resin composition of claim 1; and a metal layer bonded to the insulating layer.

15. A printed wiring board comprising: an insulating layer including a cured product of the resin composition of claim 1; and conductor wiring formed on the insulating layer.

* * * * *